United States Patent
Rao Subbu et al.

(10) Patent No.: US 9,530,523 B2
(45) Date of Patent: Dec. 27, 2016

(54) THERMAL DISTURB AS HEATER IN CROSS-POINT MEMORY

(71) Applicant: Intel Corporation, Santa Clara, CA (US)

(72) Inventors: Gayathri Rao Subbu, Mountain View, CA (US); Kiran Pangal, Fremont, CA (US); Nathan Franklin, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 14/314,200

(22) Filed: Jun. 25, 2014

(65) Prior Publication Data

US 2015/0380111 A1    Dec. 31, 2015

(51) Int. Cl.
| | |
|---|---|
| *G11C 29/00* | (2006.01) |
| *G11C 29/52* | (2006.01) |
| *G11C 13/00* | (2006.01) |
| *G06F 11/10* | (2006.01) |
| *G11C 7/04* | (2006.01) |

(52) U.S. Cl.
CPC ........... *G11C 29/52* (2013.01); *G06F 11/1068* (2013.01); *G11C 7/04* (2013.01); *G11C 13/0004* (2013.01); *G11C 13/0033* (2013.01)

(58) Field of Classification Search
CPC .... G11C 11/401; G11C 11/56; G11C 11/1068; G11C 2212/403; G11C 29/52; G11C 7/04; G11C 13/0004; G11C 13/0033
USPC ................ 714/718–721, 733–734, 745, 763, 764,714/769, 770, 771, 744, 6.1, 6.13, 6.2, 6.21,714/6.22, 6.24, 6.3, 6.31, 6.32, 25, 52; 365/200, 365/201
See application file for complete search history.

(56) References Cited

U.S. PATENT DOCUMENTS

| | | | |
|---|---|---|---|
| 7,200,780 B2 * | 4/2007 | Kushida ............... | G06F 11/1008 365/201 |
| 7,248,515 B2 * | 7/2007 | Chevallier .......... | G11C 16/3418 365/200 |
| 7,590,919 B2 * | 9/2009 | Kanno .................... | G11C 11/56 714/763 |
| 2004/0114419 A1 | 6/2004 | Lowrey et al. | |
| 2007/0159871 A1 | 7/2007 | Osada et al. | |
| 2009/0103358 A1 | 4/2009 | Sommer et al. | |
| 2012/0287692 A1 | 11/2012 | Rotbard et al. | |
| 2014/0136915 A1 | 5/2014 | Hyde et al. | |

OTHER PUBLICATIONS

International Search Report and Written Opinion received for PCT Application No. PCT/US2015/030926, mailed Aug. 13, 2015, 17 pages.

* cited by examiner

*Primary Examiner* — Christine Tu
(74) *Attorney, Agent, or Firm* — Grossman, Tucker, Perreault & Pfleger, PLLC (57) ABSTRACT

The present disclosure relates to thermal disturb as heater in cross-point memory. An apparatus includes a memory controller. The memory controller is configured to identify a target memory cell in response to at least one of a selection failure and a set fail memory read error associated with the target memory cell. The memory controller is further configured to apply a first sequence of recovery pulses to a first number of selected adjacent memory cells adjacent the target memory cell, the first sequence of recovery pulses configured to induce heating in the target memory cell.

21 Claims, 3 Drawing Sheets

THERMAL DISTURB AS HEATER IN CROSS-POINT MEMORY

FIELD

The present disclosure relates to using thermal disturb as a heater in a cross-point memory.

BACKGROUND

Phase change memory is a memory device which typically uses a chalcogenide material for the memory elements. In operation, the phase change memory stores information on the memory element by changing the phase of the memory element between amorphous and crystalline phases. The chalcogenide material may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one).

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

In a phase change memory, a memory element is the unit that actually stores information. The memory element may be included in a memory cell that also includes a selector, i.e., a select device coupled to the memory element. The select devices are configured to facilitate combining a plurality of memory elements into an array.

Phase change memory cells may be arranged in a cross-point memory array including row address lines and column address lines arranged in a grid. The row address lines and column address lines, called word lines (WLs) and bit lines (BLs), respectively, cross in the formation of the grid and each memory cell is coupled between a WL and a BL where the WL and BL cross (i.e., cross-point). It should be noted that row and column are terms of convenience used to provide a qualitative description of the arrangement of WLs and BLs in cross-point memory.

In operation, a memory cell may be selected, read and/or written (i.e., programmed) several times. Over time, threshold voltages associated with selecting, reading and/or writing may change, in part, due to material characteristics of the chalcogenide material. As a result, a memory cell may become unselectable ("fail open"), a memory element in the set state may be read as the reset state ("set fail") and/or a memory element in the reset state may be read as the set state ("reset fail"). Failed open and set fail correspond to an increased threshold voltage and reset fail corresponds to a decreased threshold voltage.

In a read operation, a target memory cell is selected via the application of a first bias voltage to the WL and a second bias voltage to the BL that cross at the target memory cell for a time interval. A resulting differential bias voltage across the memory cell (Vread) is configured to be greater than a maximum set voltage and less than a minimum reset voltage for the memory cell. The set voltage is related to a threshold voltage of the select device. The set voltage corresponds to the threshold voltage for "turning on" the select device, i.e., for transitioning the select device from a high impedance state to a low impedance state. The reset voltage is related to a sum of the threshold voltage of the select device and a threshold voltage of the memory element. The reset voltage is configured to transition both the select device and the memory element to low impedance states. In a fail open situation, in response to Vread, a select device may not turn on and the memory cell may then not be selected. A fail open may be due to a high impedance of the select device and/or a high impedance of the memory element. A fail open may be detected by a lack of change in current through a memory cell after application of Vread. If the memory cell is not fail open, the select device may turn on in response to Vread and the target memory element may or may not snap back, depending on whether the memory element is in the crystalline state (set) or the amorphous state (reset). Snap back is a property of the composite memory element that results in an abrupt change in conductivity and an associated abrupt change in the voltage across the memory element. If the memory element is in the reset state (i.e., relatively high impedance), in response to application of Vread, no snap back may occur. If the memory element is in the set state (i.e., relatively low impedance), the memory element may snap back in response to application of Vread. Sense circuitry, coupled to the memory cell, is configured to detect the presence or absence of snap back in a sensing time interval. The presence of snap back may then be interpreted as a logic one and the absence of snap back as a logic zero.

During a programming operation, the phase of the memory element may be changed by the application of a differential bias voltage across the memory cell followed by a programming current configured to heat the memory element. The differential bias voltage may be maintained across the memory cell for a first time period sufficient to cause the memory element to snap back and then the programming current maintained for a second time period to change the state of the memory element. The programming current may be configured to set the memory element or may be configured to reset the memory element. In a set fail situation, a threshold voltage of the memory cell after application of the programming current may be greater than Vread. Thus, although the programmed state of the memory cell is set, application of Vread may not result in a snap back, i.e., read state corresponds to reset. In a reset fail situation, a threshold voltage of the memory cell after application of the programming current may be less than Vread. Thus, although the programmed state of the memory cell is reset, application of Vread may result in a snap back, i.e., read state corresponds to set.

Generally, this disclosure describes a system and method configured to recover a set fail and/or fail open memory cell (target memory cell) utilizing thermal disturb to provide local heating of the target memory cell. Generally, thermal disturb corresponds to unintentionally programming a memory cell from a reset state to a set state because of heat generated when programming a neighbor memory cell. Local heating of a target memory cell may intentionally be produced through Joule heating by applying a sequence of recovery pulses to a plurality of memory cells adjacent the target memory cell. The sequence of recovery pulses is configured to generate local heating of the target cell and, thus, a reduction in threshold voltage as a result of the heating. Joule heating is also known as resistive heating and corresponds to heat released when current flows through a conductor.

In operation, target memory cell(s) may be identified in response to an error correction code (ECC) check following a read operation and/or in response to an attempt to select a target memory cell for a memory access operation. As a result of the ECC check, the address(es) of memory cells corresponding to error bit(s) and type of fail (e.g., set fail, reset fail) may be identified by, e.g., ECC logic. In response to a failed attempt to select a memory cell, an address of each unselectable memory cell may be stored with a fail open type of fail identifier, by, e.g., memory controller logic.

A method and system consistent with the present disclosure may then be configured to apply a sequence of recovery pulses to selected adjacent memory cells for each memory cell whose error state corresponded to set fail and/or fail open. If the selected adjacent memory cells currently store data, then the data may be moved (i.e., written to other memory cells) prior to application of the recovery pulses. In this manner, local heating may be induced in the target memory cell(s) configured to reduce a related threshold voltage. Thus, operation of a memory array that includes the target memory cells may be improved.

Figure 1:
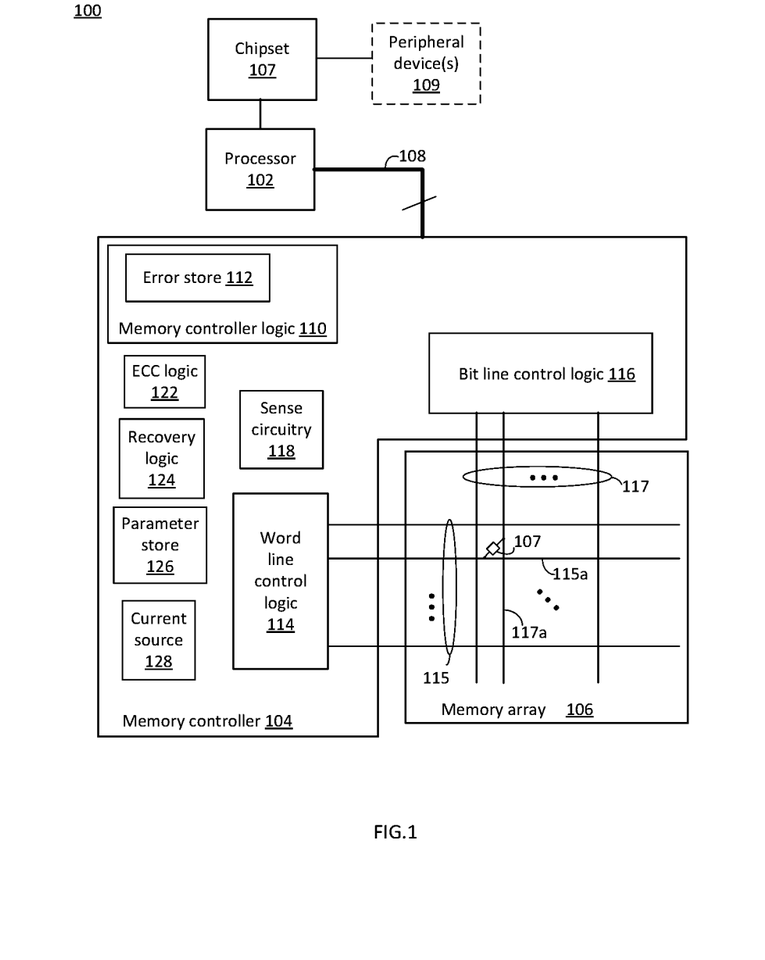
FIG. 1 illustrates a system block diagram consistent with several embodiments of the present disclosure.

FIG. 1 illustrates a system block diagram 100 consistent with several embodiments of the present disclosure. System 100 may correspond to a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone.

System 100 includes a processor 102, a memory controller 104, a memory array 106 and a chipset 107. In some embodiments, system 100 may include one or more peripheral device(s) 109 coupled to system 100 by chipset 107. Peripheral device(s) 109 may include, for example, user interface device(s) including a display, a touch-screen display, printer, keypad, keyboard, etc., communication logic, wired and/or wireless, storage device(s) including hard disk drives, solid-state drives, removable storage media, etc.

The processor 102 is coupled to the memory controller 104 by bus 108. Processor 102 may provide read and/or write requests including memory address(es), and/or associated data to memory controller 104 and may receive read data from memory controller 104. For example, processor 102 may receive one or more memory access request(s) from one or more of the peripheral devices 109 and may provide corresponding read and/or write requests to memory controller 104. Memory controller 104 is configured to perform memory access operations, e.g., reading a target memory cell and/or writing to a target memory cell, ECC check operations and memory cell recovery operations. It should be noted that system 100 is simplified for ease of illustration and description.

Memory array 106 corresponds to a phase change cross-point memory and includes a plurality of word lines 115, a plurality of bit lines 117 and a plurality of memory cells, e.g., memory cell 107. Each memory cell is coupled between a word line ("WL") and a bit line ("BL") at a cross point of the WL and the BL. Each memory cell includes a memory element configured to store information and a memory cell select device (i.e., selector) coupled to the memory element. Select devices may include ovonic threshold switches, diodes, bipolar junction transistors, field-effect transistors, etc. Memory array 106 is configured to store binary data and may be written to (i.e., programmed) or read from. Memory array 106 may include one or more layers of memory cells and associated WLs and BLs. Memory array 106 may have an associated density, i.e., number of memory cells per unit area or unit volume.

Memory controller 104 includes memory controller logic 110, WL control logic 114, BL control logic 116, sense circuitry 118, ECC logic 122, recovery logic 124, a parameter store 126 and a current source 128. Memory controller logic 110 includes an error store 112. Memory controller logic 110 is configured to perform operations associated with memory controller 104. For example, memory controller logic 110 may manage communications with processor 102. Memory controller logic 110 may be configured to identify one or more target WLs associated with each received memory address. Memory controller logic 110 may be configured to manage operations of WL control logic 114 and BL control logic 116 based, at least in part, on the target WL identifiers.

WL control logic 114 is configured to receive target WL address(es) from memory controller logic 110 and to select one or more WLs for reading and/or writing operations. For example, WL control logic 114 may be configured to select a target WL by coupling a WL select bias voltage to the target WL. WL control logic 114 may be configured to deselect a WL by decoupling the target WL from the WL select bias voltage and/or by coupling a WL deselect bias voltage to the WL. WL control logic 114 may be coupled to a plurality of WLs 115 included in memory array 106. Each WL may be coupled to a number of memory cells corresponding to a number of BLs 117.

BL control logic 116 is configured to select one or more BLs for reading and/or writing operations. BL control logic 116 may be configured to select a target BL by coupling a BL select bias voltage to the target BL. BL control logic 116 may be configured to deselect a BL by decoupling the target BL from the BL select bias voltage and/or by coupling a BL deselect bias voltage to the BL.

Memory controller logic 110 is configured to manage select, read and write operations of WL control logic 114 and BL control logic 116 and to receive sense data from sense circuitry 118. Memory controller logic 110 is configured to detect memory cell selection failures (i.e., open fails) and to facilitate operations of ECC logic 122 and recovery logic 124, as described herein.

Memory controller logic 110 may be configured to determine whether or not a target memory cell, e.g., memory cell 107, is selected, based, at least in part, on an output from sense circuitry 118. When a memory cell is selected, a selector device impedance transitions from a relatively high impedance to a relatively low impedance. When the impedance of the select device memory cell is relatively low, the memory cell is "selected". Thus, memory controller logic 110 may be configured to determine whether the memory cell 107 has been selected based, at least in part, on the impedance of the memory cell 107. For example, sense circuitry 118 may be configured to sense a current through memory cell 107 and to provide an indication of the sensed current to memory controller logic 110. Thus, memory controller logic 110 may determine that a cell is selected if a sensed current increases indicating that the impedance has decreased (for a fixed supply voltage). If memory controller logic 110 determines that memory cell 107 has been selected, memory access operation(s) (e.g., read and/or write) on memory cell 107 may proceed. If, after applying a select threshold voltage, memory controller logic 110 determines that memory cell 107 has not been selected, memory controller logic 110 is configured to store a memory cell identifier associated with memory cell 107 and a fail type indicator corresponding to a fail open in error store 112.

If memory cell 107 is successfully selected, sense circuitry 118 is further configured to detect presence or absence of a snap back event during a sense interval, e.g., during a read operation. Sense circuitry 118 may be configured to provide a logic level output related to the result of the read operation to, e.g., memory controller logic 110. For example, in response to a signal from memory controller logic 110, WL control logic 114 and BL control logic 116 may be configured to select memory cell, e.g., memory cell 107, for a read operation by coupling, e.g., WL 115a to WL select bias voltage and, e.g., BL 117a to BL select bias voltage. A differential bias voltage across memory cell 107 may then correspond to Vread. Sense circuitry 118 may then be configured to monitor the voltage across memory cell 107 in order to determine whether or not a snap back event occurs.

ECC logic 122 is configured to provide error checking functionality for memory controller 104. For example, ECC logic 122 may be configured to attach parity information, e.g., an ECC, to data being stored (i.e., during write operations) in memory array 106. In response to and/or as part of a read operation, the ECC logic 122 may be further configured to determine parity checks (i.e., error syndromes) that may then be utilized to detect errors, identify the bits with errors and/or correct data read from memory array 106. One or more techniques may be used for error correction and/or detection, e.g., Hamming codes, Reed-Solomon codes, Low Density Parity Check Codes (LDPCs), BCH (Bose-Chaudhuri-Hocquenghem) codes, etc. Of course, the listed error correction codes are merely examples and other ECCs configured to detect memory cell errors, to identify the error cells and/or to correct a number of detected errors may be utilized consistent with the present disclosure.

ECC 122 may detect more errors than can be corrected and/or the associated bits identified by ECC 122. If ECC 122 detects more errors than can be corrected and/or the associated bits identified, the ECC 122 may be configured to notify the memory controller logic 110. Memory controller logic 110 may then be configured to communicate a memory read failure (i.e., fatal error) to processor 102.

If the number of errors detected by ECC 122 is within the range of errors that can be corrected and/or the associated bits identified, then ECC 122 may be configured to provide the addresses and fail type (e.g., set fail, reset fail) to memory controller logic 110. Memory controller logic 110 may be configured to determine whether the addresses correspond to repeat errors. In other words, some bit read errors may be due to random processes not necessarily associated with the threshold voltages of the associated memory cells. If a number of errors for an identified memory cell is below an error threshold, memory controller logic 110 may store the memory cell identifier and fail type indicator and increment an error counter associated with the memory cell identifier in error store 112. If the number of errors for the identified memory cell is at or above the error threshold, recovery logic 124 may be notified for set fail errors. The notice may include a memory cell identifier (e.g., address and/or WL identifier and BL identifier) and the fail type. Reset fails may be managed by memory controller logic 110 using conventional techniques. For example, conventional techniques may include refreshing the memory cell by reading the data and then writing the data back to the memory cell.

Recovery logic 124 is configured to manage recovery of fail opens and/or set fails for associated memory cells identified by ECC 122 and/or memory controller logic 110. Recovery logic 124 is configured to apply a sequence of recovery pulses to a plurality of memory cells (adjacent memory cells) adjacent a target memory cell. Specific parameters related to the sequence of recovery pulses and a number of adjacent memory cells to be selected may be stored in parameter store 126.

Recovery logic 124 is configured to receive from memory controller logic 110, memory cell identifier(s) and associated fail type indicator(s) for each bit error that is a set fail or a fail open. For each identified memory cell, recovery logic 124 is configured to select a number of adjacent memory cells. For example, recovery logic 124 may be configured to retrieve the number of adjacent memory cells to select from parameter store 126. Prior to applying the sequence of recovery pulses to the selected adjacent memory cells, recovery logic 124 is configured to provide associated selected adjacent memory cell identifiers to memory controller logic 110. Memory controller logic 110 may then move data from any programmed identified selected adjacent memory cell.

Figure 2:
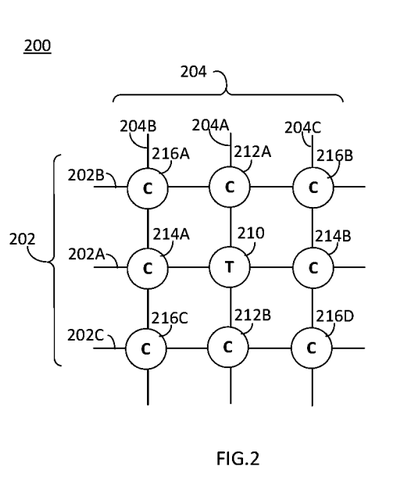
FIG. 2 illustrates an example portion of a cross-point memory array including a target cell and a plurality of adjacent cells consistent with one embodiment of the present disclosure.

FIG. 2 illustrates an example portion of a cross-point memory array 200 including a plurality of WLs, collectively 202, a plurality of BLs, collectively 204, a target memory cell ("T") 210 and a plurality of adjacent memory cells ("C") 212A, 212B, 214A, 214B, 216A, . . . , 216D, consistent with one embodiment of the present disclosure. For example, the portion of the cross-point memory array 200 may correspond to a portion of memory array 106 of FIG. 1. Column adjacent memory cells 212A, 212B share a BL 204A with the target memory cell 210 and row adjacent memory cells 214A, 214B share a WL 202A with the target memory cell 210. Diagonal adjacent memory cells 216A, . . . , 216D are coupled between respective WLs adjacent to WL 202A (i.e., WL 202B, 202C) and respective BLs adjacent to BL 204A (i.e., BL 204B, 204C). For example, diagonal adjacent memory cell 216A is coupled between WL 202B and BL 204B, diagonal adjacent memory cell 216B is coupled between WL 202B and BL 204C, diagonal adjacent memory cell 216C is coupled between WL 202C and BL 204B and diagonal adjacent memory cell 216D is coupled between WL 202C and BL 204C. Diagonal adjacent memory cells 216A, . . . , 216D are relatively more distant from target memory cell 210, e.g., by a factor of $\sqrt{2}$ than row adjacent memory cells 214A, 214B or column adjacent memory cells 212A, 212B for equally spaced WLs and BLs.

Heating effects induced in target memory cell 210 from a sequence of recovery pulses may be related to a distance between the target memory cell 210 and the adjacent memory cells 212A, 212B, 214A, 214B, 216A, . . . , and/or 216D receiving the sequence of recovery pulses. The distance may be related to a density of the memory cell array, e.g., memory cell array 106, and/or to whether the adjacent memory cells are diagonal adjacent or row and/or column adjacent. Heating effects may be further related to an amount of current applied to the adjacent memory cells. The amount of current may be limited by, e.g., a maximum current capability of current source 128. Heating effects may be further related to the number of adjacent memory cells configured to receive the sequence of recovery pulses. Thus, characteristics of the heating induced in the target memory cell 210 may be selected and/or adjusted through selection of a plurality of parameters stored in parameter store 126, as described herein.

Turning again to FIG. 1, parameter store 126 is configured to store the number of adjacent memory cells to select and parameters associated with the sequence of recovery pulses. The number of adjacent memory cells to select may be based, at least in part, on whether the fail type is set fail or failed open, memory array density and/or maximum current available from current source 128. Parameters associated with the sequence of recovery pulses may include a number N of recovery pulses in the sequence, a pulse width PW, a pulse amplitude PA. In some embodiments, the parameters may include a duty factor for each pulse in the sequence of recovery pulses. The number of adjacent memory cells to select may be related to physical characteristics of memory array 106. A relatively smaller number of selected adjacent memory cells may correspond to a relatively more dense memory array with memory cells spaced relatively more closely together. For example, row adjacent memory cells or column adjacent memory cells may be selected. A relatively larger number of selected adjacent memory cells may correspond to a relatively less dense memory array with relatively larger memory cell spacing. For example, row adjacent and column adjacent memory cells may be selected and, in some cases, diagonal adjacent memory cells may also be selected.

An amount of heating produced by each recovery pulse may be related to N, PW and/or PA. PA may be limited by capabilities of memory controller 104 and current source 128. For example, a maximum PA may be limited by a maximum current supply capability of current source 128. A longer duration PW, a relatively higher PA and/or a relatively larger N may be configured to provide relatively more Joule heating to the target memory cell 107. For example, N may be in the range of ten thousand (1E4) to one million (1E6) recovery pulses. In another example, PW may be in the range of ten (10) nanoseconds (ns) to five hundred (500) ns. In another example, PA may be in the range of fifty (50) microamps (μA) to six hundred (600) μA. A duty factor of each pulse may be on the order of 50% to 60% of a write cycle. A write cycle includes selecting the target memory cell (i.e., selecting the target WL and the target BL), applying the differential bias voltage and application of the recovery pulse. A duty factor of each pulse may be on the order of 50%, corresponding to a PW of one-half a pulse period PP. Thus, for example, a write cycle period may be in the range of twenty (20) ns to one microsecond (μs) for a 50% duty factor.

Recovery logic 124 may then apply the sequence of recovery pulses to the selected adjacent memory cells. After the sequence of recovery pulses has been applied, memory controller logic 110 may be configured to determine whether the recovery has been successful. For example, memory controller 110 may be configured to attempt to select the target memory cell 107 and/or to set (i.e., program) the target memory cell 107 then read the target memory cell 107 to determine whether the recovery has been successful. If the recovery has not been successful, the recovery logic 124 may be configured to repeat application of the sequence of recovery pulses to adjacent memory cells. Parameters associated with the sequence of recovery pulses may be adjusted and/or a number of adjacent memory cells selected may be increased. A number of recovery attempts may be limited. For example, maximum number of recovery attempts may be stored in parameter store 126.

Thus, a target memory cell may be identified in response to an ECC check following a read operation and/or in response to an attempt to select the target memory cell for a memory access operation. A sequence of recovery pulses may then be applied to selected adjacent memory cells for each memory cell whose error state corresponded to set fail and/or fail open. Parameters associated with the sequence of recovery pulses may be adjustable and/or selectable. If the selected adjacent memory cells currently store data, then the data may be moved (i.e., written to other memory cells) prior to application of the sequence of recovery pulses. Thus, local heating may be induced in the target memory cell(s), the heating configured to reduce a threshold voltage of the target memory cell. Thus, operation of a memory array that includes the target memory cells may be improved.

Figure 3:
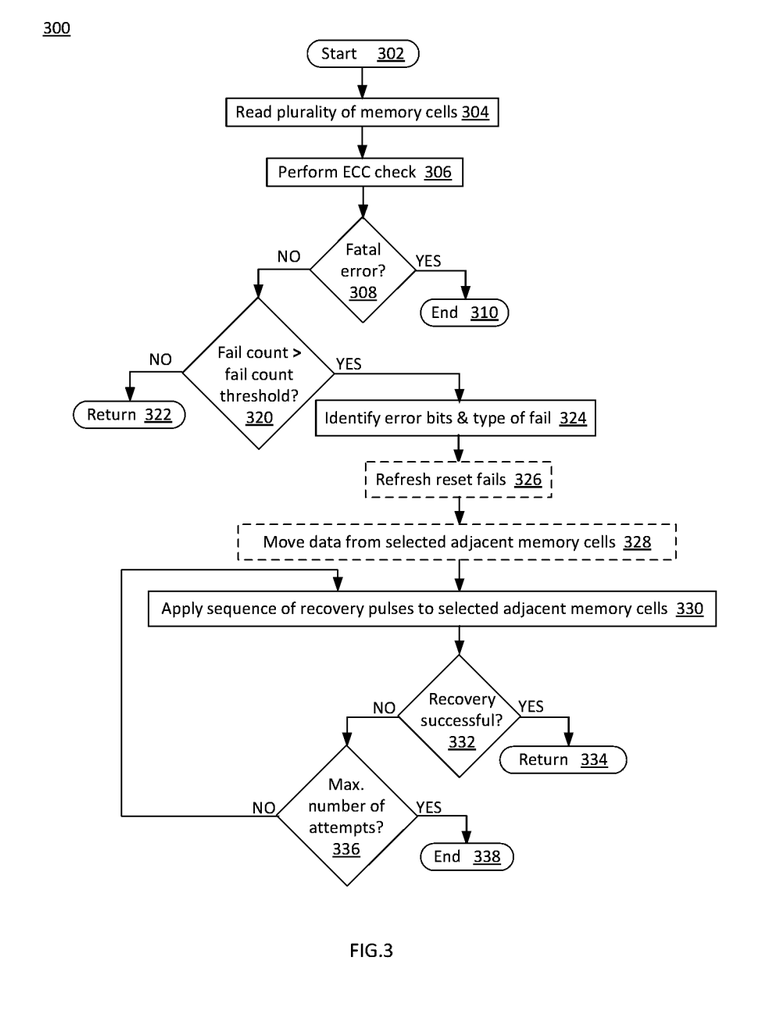
FIG. 3 illustrates a flowchart of operations for recovering set, reset and/or open fails consistent with various embodiments of the present disclosure.

FIG. 3 illustrates a flowchart 300 of operations for recovering a set fail, reset fail and/or a fail open, consistent with various embodiments of the present disclosure. The operations may be performed, for example, by a memory controller, e.g., memory controller 104, including memory controller logic 110, WL control module 114, BL control module 116, sense circuitry 118, ECC logic 122 and/or recovery logic 124. Flowchart 300 depicts exemplary operations configured to recover memory cell(s) with relatively high threshold voltage(s), e.g., set fail and/or fail open, and/or to refresh memory cell(s) with a relatively low threshold voltage, e.g., reset fail. In particular, flowchart 300 depicts exemplary operations configured to utilize thermal disturb by cycle-programming adjacent memory cells utilizing a sequence of recovery pulses thereby heating a target memory cell, as described herein.

Operations of flowchart 300 may start at operation 302. A plurality of memory cells may be read at operation 304. An ECC check may be performed at operation 306. Whether there is a fatal error may be determined at operation 308. For example, a number of memory read errors that exceeds the error correction capability of the ECC corresponds to a fatal error. If the error is fatal, program flow may end at operation 310. If the error is not fatal, whether a fail count is greater than a fail count threshold may be determined at operation 320. If the fail count is not greater than the fail count threshold, program flow may return at operation 322. For example, the fail count threshold may be configured to accommodate transient random errors that may not be due to an increase in threshold voltage. If the fail count is greater than the fail count threshold, the error bits may be identified and the type of fail may be identified at operation 324. For example, memory cells associated with the error bits may be identified. In some embodiments, reset fails may be refreshed at operation 326. In some cases, data from selected adjacent cell(s) may be moved at operation 328. For example, data may be moved from identified selected adjacent memory cells prior to application of a sequence of recovery pulses. A sequence of recovery pulses may be applied to the selected adjacent cell(s) at operation 330. Whether the recovery was successful may be determined at operation 332. For example, an attempt may be made to select and/or set the target memory cell. If the recovery was successful, program flow may return at operation 334. If the recovery was not successful, whether a maximum number of attempts to recover the target memory cell has elapsed may be determined at operation 336. If the maximum number of attempts to recover the target memory cell has not elapsed, program flow may proceed to operation 330. If the maximum number of attempts to recover has elapsed, program flow may end at operation 338. Thus, the operations of flowchart 300 are configured to utilize thermal disturb to recover set fails and/or fail opens.

While FIG. 3 illustrates various operations according one embodiment, it is to be understood that not all of the operations depicted in FIG. 3 are necessary for other embodiments. Indeed, it is fully contemplated herein that in other embodiments of the present disclosure, the operations depicted in FIG. 3 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

In some embodiments, a hardware description language may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Thus, a system and method configured to recover a set fail and/or fail open memory cell utilizing thermal disturb to provide local heating of the target memory cell has been described. Local heating of a target memory cell may intentionally be produced by applying a sequence of recovery pulses to a plurality of memory cells adjacent the target memory cell. The sequence of recovery pulses is configured to generate local heating of the target cell and, thus, a reduction in threshold voltage as a result of the heating.

In operation, target memory cell(s) may be identified in response to an error correction code (ECC) check following a read operation and/or in response to an attempt to select a target memory cell for a memory access operation. As a result of the ECC check, the address(es) of memory cells corresponding to error bit(s) and type of fail (e.g., set fail, reset fail) may be identified by, e.g., ECC logic. In response to a failed attempt to select a memory cell, an address of each unselectable memory cell may be stored with a set fail and/or fail open type of fail identifier, by, e.g., memory controller logic. A method and system consistent with the present disclosure may then be configured to apply a sequence of recovery pulses to selected adjacent memory cells for each memory cell whose error state corresponded to set fail and/or fail open. If the selected adjacent memory cells currently stores data, then the data may be moved (i.e., written to other memory cells) prior to application of the sequence of recovery pulses. In this manner, local heating may be induced in the target memory cell(s) configured to reduce a related threshold voltage. Thus, operation of a memory array that includes the target memory cells may be improved.

EXAMPLES

Examples of the present disclosure include subject material such as a method, means for performing acts of the method, a device, or of an apparatus or system related to using thermal disturb as a heater in a cross-point memory, as discussed below.

Example 1

According to this example there is provided an apparatus including a memory controller configured to identify a target memory cell in response to at least one of a selection failure and a set fail memory read error associated with the target memory cell. The memory controller is further configured to apply a first sequence of recovery pulses to a first number of selected adjacent memory cells adjacent the target memory cell, the first sequence of recovery pulses configured to induce heating in the target memory cell.

Example 2

This example includes the elements of example 1, wherein the first sequence of recovery pulses comprises a number (N) recovery pulses and each recovery pulse has a pulse amplitude (PA) and a pulse width (PW).

Example 3

This example includes the elements of example 1, wherein the memory controller comprises error code correction (ECC) logic, the ECC logic configured to perform an ECC check, the memory read error related to the ECC check.

Example 4

This example includes the elements of example 3, wherein the ECC logic is configured to perform the ECC check in response to a read operation.

Example 5

This example includes the elements of example 3, wherein the ECC logic is configured to determine a number of memory read errors and to notify the memory controller if the number of memory read errors corresponds to a fatal error.

Example 6

This example includes the elements of example 3, wherein the ECC logic is configured to select a type of memory read error from the group comprising set fail or reset fail.

Example 7

This example includes the elements of example 3, wherein the memory controller is configured to perform a refresh operation on a second memory cell, the second memory cell identified as a reset fail memory read error by the ECC logic.

Example 8

This example includes the elements of any one of examples 1 through 7, wherein the memory controller is configured to monitor a count of set fail memory read errors associated with the target memory cell.

Example 9

This example includes the elements of any one of examples 1 through 7, wherein the memory controller is configured to determine the first number of adjacent memory cells to select based, at least in part, on one or more of memory array density and maximum available current.

Example 10

This example includes the elements of example 2, wherein the memory controller is configured to select one or more of N, PA and PW based, at least in part, on one or more of memory array density and maximum available current.

Example 11

This example includes the elements of any one of examples 1 through 7, wherein the first number of selected adjacent memory cells comprises one or more of column adjacent memory cells, row adjacent memory cells and diagonal adjacent memory cells.

Example 12

This example includes the elements of any one of examples 1 through 7, wherein the memory controller is further configured to determine whether a threshold voltage associated with the target memory cell is at or below a target threshold voltage after application of the first sequence of recovery pulses.

Example 13

This example includes the elements of example 12, wherein the memory controller is configured to adjust one or more parameters associated with the first sequence of recovery pulses to generate a second sequence of recovery pulses if the determined threshold voltage is greater than the target threshold voltage and to apply the second sequence of recovery pulses to at least the first number of selected adjacent memory cells.

Example 14

This example includes the elements of example 13, wherein the memory controller is further configured to repeat application of the second sequence of recovery pulses up to a maximum number of recovery attempts if the determined threshold voltage is greater than the target threshold voltage.

Example 15

This example includes the elements of any one of examples 1 through 7, wherein the memory controller is further configured to identify the first number of selected adjacent memory cells and to move data stored in any one or more of the first number of selected adjacent memory cells, prior to application of the first sequence of recovery pulses.

Example 16

This example includes the elements of example 2, wherein N is between ten thousand and one million, PA is between fifty microamperes (µA) and six hundred µA and PW is between ten nanoseconds and five hundred nanoseconds.

Example 17

According to this example there is provided a method including identifying, by a memory controller, a target memory cell in response to at least one of a selection failure and a set fail memory read error associated with the target memory cell; and applying, by the memory controller, a first sequence of recovery pulses to a first number of selected adjacent memory cells adjacent the target memory cell, the first sequence of recovery pulses configured to induce heating in the target memory cell.

Example 18

This example includes the elements of example 17, wherein the first sequence of recovery pulses comprises a number (N) recovery pulses and each recovery pulse has a pulse amplitude (PA) and a pulse width (PW).

Example 19

This example includes the elements of example 17, and further includes performing, by error code correction (ECC) logic, an ECC check, the memory read error related to the ECC check.

Example 20

This example includes the elements of example 19, wherein the ECC logic is configured to perform the ECC check in response to a read operation.

Example 21

This example includes the elements of example 19, and further includes determining, by the ECC logic, a number of memory read errors; and notifying, by the ECC logic, the memory controller if the number of memory read errors corresponds to a fatal error.

Example 22

This example includes the elements of example 19, and further includes selecting, by the ECC logic, a type of memory read error from the group comprising set fail or reset fail.

Example 23

This example includes the elements of example 19, and further includes identifying, by the ECC logic, a second memory cell as a reset fail memory read error; and performing, by the memory controller, a refresh operation on the second memory cell.

Example 24

This example includes the elements of example 17, and further includes monitoring, by the memory controller, a count of set fail memory read errors associated with the target memory cell.

Example 25

This example includes the elements of example 17, and further includes determining, by the memory controller, the first number of adjacent memory cells to select based, at least in part, on one or more of memory array density and maximum available current.

Example 26

This example includes the elements of example 18, and further includes selecting, by the memory controller, one or more of N, PA and PW based, at least in part, on one or more of memory array density and maximum available current.

Example 27

This example includes the elements of example 17, wherein the first number of selected adjacent memory cells comprises one or more of column adjacent memory cells, row adjacent memory cells and diagonal adjacent memory cells.

Example 28

This example includes the elements of example 17, and further includes determining, by the memory controller, whether a threshold voltage associated with the target memory cell is at or below a target threshold voltage after application of the first sequence of recovery pulses.

Example 29

This example includes the elements of example 28, and further includes adjusting, by the memory controller, one or more parameters associated with the first sequence of recovery pulses to generate a second sequence of recovery pulses if the determined threshold voltage is greater than the target threshold voltage; and applying, by the memory controller, the second sequence of recovery pulses to at least the first number of selected adjacent memory cells.

Example 30

This example includes the elements of example 29, and further includes repeating, by the memory controller, application of the second sequence of recovery pulses up to a maximum number of recovery attempts if the determined threshold voltage is greater than the target threshold voltage.

Example 31

This example includes the elements of example 17, and further includes identifying, by the memory controller, the first number of selected adjacent memory cells; and moving, by the memory controller, data stored in any one or more of the first number of selected adjacent memory cells, prior to application of the first sequence of recovery pulses.

Example 32

This example includes the elements of example 18, wherein N is between ten thousand and one million, PA is between fifty microamperes ($\mu$A) and six hundred $\mu$A and PW is between ten nanoseconds and five hundred nanoseconds.

Example 33

According to this example there is provided a system including a processor; a chipset configured to couple the processor to a peripheral device; a cross-point memory array comprising a plurality of memory cells; and a memory controller. The memory controller is configured to identify a target memory cell in response to at least one of a selection failure and a set fail memory read error associated with the target memory cell. The memory controller is further configured to apply a first sequence of recovery pulses to a first number of selected adjacent memory cells adjacent the target memory cell, the first sequence of recovery pulses configured to induce heating in the target memory cell.

Example 34

This example includes the elements of example 33, wherein the first sequence of recovery pulses comprises a number (N) recovery pulses and each recovery pulse has a pulse amplitude (PA) and a pulse width (PW).

Example 35

This example includes the elements of example 33, wherein the memory controller comprises error code correction (ECC) logic, the ECC logic configured to perform an ECC check, the memory read error related to the ECC check.

Example 36

This example includes the elements of example 35, wherein the ECC logic is configured to perform the ECC check in response to a read operation.

Example 37

This example includes the elements of example 35, wherein the ECC logic is configured to determine a number of memory read errors and to notify the memory controller if the number of memory read errors corresponds to a fatal error.

Example 38

This example includes the elements of example 35, wherein the ECC logic is configured to select a type of memory read error from the group comprising set fail or reset fail.

Example 39

This example includes the elements of example 35, wherein the memory controller is configured to perform a refresh operation on a second memory cell, the second memory cell identified as a reset fail memory read error by the ECC logic.

Example 40

This example includes the elements of any one of examples 33 through 39, wherein the memory controller is configured to monitor a count of set fail memory read errors associated with the target memory cell.

Example 41

This example includes the elements of any one of examples 33 through 39, wherein the memory controller is configured to determine the first number of adjacent memory cells to select based, at least in part, on one or more of memory array density and maximum available current.

Example 40

This example includes the elements of example 34, wherein the memory controller is configured to select one or more of N, PA and PW based, at least in part, on one or more of memory array density and maximum available current.

Example 43

This example includes the elements of any one of examples 33 through 39, wherein the first number of selected adjacent memory cells comprises one or more of column adjacent memory cells, row adjacent memory cells and diagonal adjacent memory cells.

Example 44

This example includes the elements of any one of examples 33 through 39, wherein the memory controller is further configured to determine whether a threshold voltage associated with the target memory cell is at or below a target threshold voltage after application of the first sequence of recovery pulses.

Example 45

This example includes the elements of example 44, wherein the memory controller is configured to adjust one or more parameters associated with the first sequence of recovery pulses to generate a second sequence of recovery pulses if the determined threshold voltage is greater than the target threshold voltage and to apply the second sequence of recovery pulses to at least the first number of selected adjacent memory cells.

Example 46

This example includes the elements of example 45, wherein the memory controller is further configured to repeat application of the second sequence of recovery pulses up to a maximum number of recovery attempts if the determined threshold voltage is greater than the target threshold voltage.

Example 47

This example includes the elements of any one of examples 33 through 39, wherein the memory controller is further configured to identify the first number of selected adjacent memory cells and to move data stored in any one or more of the first number of selected adjacent memory cells, prior to application of the first sequence of recovery pulses.

Example 48

This example includes the elements of example 34, wherein N is between ten thousand and one million, PA is between fifty microamperes (μA) and six hundred μA and PW is between ten nanoseconds and five hundred nanoseconds.

Example 49

Another example of the present disclosure is a system including at least one device arranged to perform the method of any one of examples 17 to 32.

Example 50

Another example of the present disclosure is a device including means to perform the method of any one of examples 17 to 32.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
a memory controller configured to identify a target memory cell in response to at least one of a selection failure and a set fail memory read error associated with the target memory cell,
the memory controller further configured to apply a first sequence of recovery pulses to a first number of selected adjacent memory cells adjacent the target memory cell, the first sequence of recovery pulses configured to induce heating in the target memory cell.

2. The apparatus of claim 1, wherein the first sequence of recovery pulses comprises a number (N) recovery pulses and each recovery pulse has a pulse amplitude (PA) and a pulse width (PW).

3. The apparatus of claim 1, wherein the memory controller comprises error code correction (ECC) logic, the ECC logic configured to perform an ECC check, the memory read error related to the ECC check.

4. The apparatus of claim 1, wherein the memory controller is further configured to determine whether a threshold voltage associated with the target memory cell is at or below a target threshold voltage after application of the first sequence of recovery pulses.

5. The apparatus of claim 4, wherein the memory controller is configured to adjust one or more parameters associated with the first sequence of recovery pulses to generate a second sequence of recovery pulses if the determined threshold voltage is greater than the target threshold voltage and to apply the second sequence of recovery pulses to at least the first number of selected adjacent memory cells.

6. The apparatus of claim 1, wherein the memory controller is further configured to identify the first number of selected adjacent memory cells and to move data stored in any one or more of the first number of selected adjacent memory cells, prior to application of the first sequence of recovery pulses.

7. The apparatus of claim 2, wherein N is between ten thousand and one million, PA is between fifty microamperes (µA) and six hundred µA and PW is between ten nanoseconds and five hundred nanoseconds.

8. A method comprising:
identifying, by a memory controller, a target memory cell in response to at least one of a selection failure and a set fail memory read error associated with the target memory cell; and
applying, by the memory controller, a first sequence of recovery pulses to a first number of selected adjacent memory cells adjacent the target memory cell, the first sequence of recovery pulses configured to induce heating in the target memory cell.

9. The method of claim 8, wherein the first sequence of recovery pulses comprises a number (N) recovery pulses and each recovery pulse has a pulse amplitude (PA) and a pulse width (PW).

10. The method of claim 8, further comprising:
performing, by error code correction (ECC) logic, an ECC check, the memory read error related to the ECC check.

11. The method of claim 8, further comprising determining, by the memory controller, whether a threshold voltage associated with the target memory cell is at or below a target threshold voltage after application of the first sequence of recovery pulses.

12. The method of claim 11, further comprising:
adjusting, by the memory controller, one or more parameters associated with the first sequence of recovery pulses to generate a second sequence of recovery pulses if the determined threshold voltage is greater than the target threshold voltage; and
applying, by the memory controller, the second sequence of recovery pulses to at least the first number of selected adjacent memory cells.

13. The method of claim 8, further comprising:
identifying, by the memory controller, the first number of selected adjacent memory cells; and
moving, by the memory controller, data stored in any one or more of the first number of selected adjacent memory cells, prior to application of the first sequence of recovery pulses.

14. The method of claim 9, wherein N is between ten thousand and one million, PA is between fifty microamperes (µA) and six hundred µA and PW is between ten nanoseconds and five hundred nanoseconds.

15. A system comprising:
a processor;
a chipset configured to couple the processor to a peripheral device;
a cross-point memory array comprising a plurality of memory cells; and
a memory controller configured to identify a target memory cell in response to at least one of a selection failure and a set fail memory read error associated with the target memory cell, the memory controller further configured to apply a first sequence of recovery pulses to a first number of selected adjacent memory cells adjacent the target memory cell, the first sequence of recovery pulses configured to induce heating in the target memory cell.

16. The system of claim 15, wherein the first sequence of recovery pulses comprises a number (N) recovery pulses and each recovery pulse has a pulse amplitude (PA) and a pulse width (PW).

17. The system of claim 15, wherein the memory controller comprises error code correction (ECC) logic, the ECC logic configured to perform an ECC check, the memory read error related to the ECC check.

18. The system of claim 15, wherein the memory controller is further configured to determine whether a threshold voltage associated with the target memory cell is at or below a target threshold voltage after application of the first sequence of recovery pulses.

19. The system of claim 18, wherein the memory controller is configured to adjust one or more parameters associated with the first sequence of recovery pulses to generate a second sequence of recovery pulses if the determined threshold voltage is greater than the target threshold voltage and to apply the second sequence of recovery pulses to at least the first number of selected adjacent memory cells.

20. The system of claim 15, wherein the memory controller is further configured to identify the first number of selected adjacent memory cells and to move data stored in any one or more of the first number of selected adjacent memory cells, prior to application of the first sequence of recovery pulses.

21. The system of claim 16, wherein N is between ten thousand and one million, PA is between fifty microamperes (µA) and six hundred µA and PW is between ten nanoseconds and five hundred nanoseconds.

* * * * *